United States Patent
Tomita et al.

(10) Patent No.: US 8,382,453 B2
(45) Date of Patent: Feb. 26, 2013

(54) PIEZOELECTRIC PUMP, COOLING DEVICE, AND ELECTRONIC APPARATUS

(75) Inventors: Minoru Tomita, Saitama (JP); Masahiro Suzuki, Kanagawa (JP); Shun Kayama, Saitama (JP); Yukiko Shimizu, Saitama (JP)

(73) Assignee: Sony Corporation, Tokyo (JP)

( * ) Notice: Subject to any disclaimer, the term of this patent is extended or adjusted under 35 U.S.C. 154(b) by 863 days.

(21) Appl. No.: 12/333,954

(22) Filed: Dec. 12, 2008

(65) Prior Publication Data

US 2009/0167109 A1    Jul. 2, 2009

(30) Foreign Application Priority Data

Dec. 27, 2007 (JP) .................... 2007-336076

(51) Int. Cl.
*H02N 2/06* (2006.01)
*F04B 17/03* (2006.01)
*H04R 17/00* (2006.01)

(52) U.S. Cl. ............... 417/413.2; 471/457; 471/567

(58) Field of Classification Search ............ 417/413.2, 417/557, 567
See application file for complete search history.

(56) References Cited

U.S. PATENT DOCUMENTS

| 7,484,940 B2* | 2/2009 | O'Neill ............. 417/413.2 |
| 7,841,843 B2* | 11/2010 | Cho et al. ........... 417/413.1 |
| 2005/0231914 A1* | 10/2005 | Mikubo et al. ........ 361/699 |
| 2006/0237171 A1* | 10/2006 | Mukasa et al. ........ 165/121 |

FOREIGN PATENT DOCUMENTS

| JP | 60-062737 | 4/1985 |
| JP | 62-186077 | 8/1987 |
| JP | 04-191480 | 7/1992 |
| JP | 2005-113918 | 4/2005 |
| JP | 2006-297295 | 11/2006 |

OTHER PUBLICATIONS

Japanese Office Action issued on Jul. 24, 2012, in connection with counterpart JP Application No. 2007-336076.

* cited by examiner

*Primary Examiner* — Tracie Y Green
(74) *Attorney, Agent, or Firm* — SNR Denton US LLP

(57) ABSTRACT

Disclosed is a piezoelectric pump. The piezoelectric pump includes a pump body, a drive unit, a detection section, and a control unit. The pump body includes a hole for introducing a fluid from outside thereinto and jetting the fluid from inside, a wall portion disposed so as to face the hole, and a piezoelectric body provided on the wall portion to vibrate the wall portion. The drive unit drives the piezoelectric body. The detection section detects a signal corresponding to a discharge rate of the fluid from the hole. The control unit controls a drive voltage and a drive frequency of the drive unit on the basis of the signal.

13 Claims, 16 Drawing Sheets

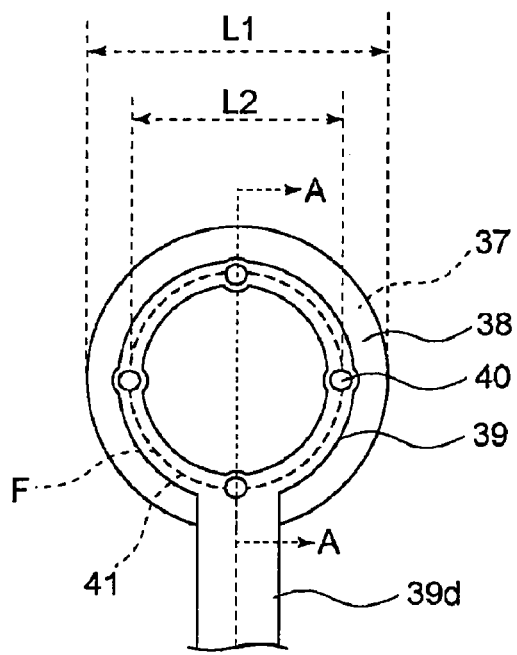
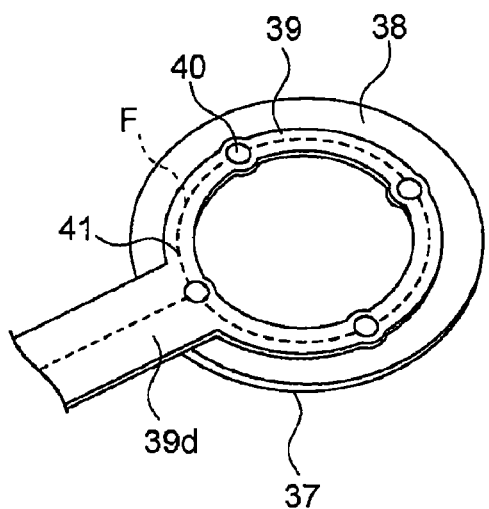
Fig. 6a  Fig. 6b
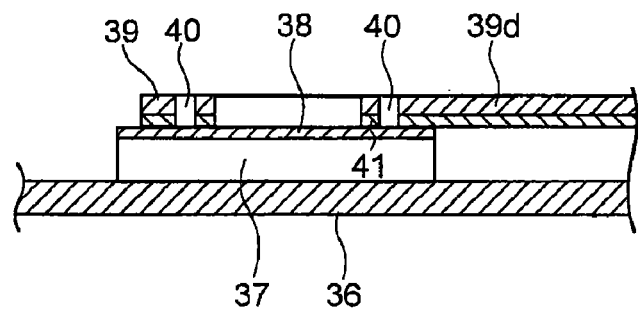
FIG.7

US 8,382,453 B2

PIEZOELECTRIC PUMP, COOLING DEVICE, AND ELECTRONIC APPARATUS

CROSS REFERENCES TO RELATED APPLICATIONS

The present invention contains subject matter related to Japanese Patent Application JP 2007-336076 filed in the Japanese Patent Office on Dec. 27, 2007, the entire contents of which being incorporated herein by reference.

BACKGROUND OF THE INVENTION

1. Field of the Invention

The present invention relates to a piezoelectric pump, a cooling device, and an electronic apparatus used for cooling a hard disk drive or the like mounted in a portable electronic apparatus such as a portable video camera.

2. Description of the Related Art

As a technique for cooling an electronic component mounted in a portable electronic apparatus, there has been disclosed, for example, a "jet generating device" for vibrating a vibration plate which uses a piezoelectric body within a chamber having a nozzle for jetting gas to jet the gas for cooling from the nozzle (see, Japanese Patent Application Laid-open No. 2006-297295 (paragraphs [0029]-[0031], FIG. 2)).

Since each cooling device using the piezoelectric body has a different natural frequency, in order to maximize the discharge rate and suction rate, it is necessary to control the drive voltage of the piezoelectric body at an optimal value and adjust the drive frequency of the piezoelectric body to the natural frequency. In the past, in a manufacturing line, the drive frequency has been adjusted to match the natural frequency of the cooling device and the adjusted value has been used as a fixed value.

SUMMARY OF THE INVENTION

However, the cooling device has a property of changing its natural frequency depending on the temperature change of the piezoelectric body. Therefore, when the drive frequency is fixed as in the past, there is a problem in that the discharge rate and suction rate of the cooling device decrease with the change of an ambient temperature.

In view of the above-mentioned circumstances, it is desirable to provide a piezoelectric pump, a cooling device, and an electronic apparatus whose discharge rate is properly controllable.

According to an embodiment of the present invention, there is provided a piezoelectric pump including a pump body, a drive unit, a detection means, and a control unit. The pump body includes a hole for introducing a fluid from outside thereinto and jetting the fluid from inside, a wall portion disposed so as to face the hole, and a piezoelectric body provided on the wall portion to vibrate the wall portion. The drive unit drives the piezoelectric body. The detection means detects a signal corresponding to a discharge rate of the fluid from the hole. The control unit controls a drive voltage and a drive frequency of the drive unit on the basis of the signal.

In the embodiment of the present invention, even if the natural frequency of the piezoelectric body changes, it is possible to detect the signal corresponding to the discharge rate of the fluid from the hole by the detection means and control the drive voltage and drive frequency of the drive unit on the basis of the signal, so that the discharge rate of the fluid from the hole can be controlled at a proper rate (its maximum).

The drive unit includes a pair of electrodes disposed to sandwich the piezoelectric body therebetween, a transformer having a primary winding connected to the control unit and a secondary winding whose both ends are connected to the respective electrodes, and an electronic variable reactance element connected in parallel with the secondary winding. The control unit includes means for varying a reactance of the electronic variable reactance element such that the discharge rate is maximized on the basis of the signal to control the drive frequency.

Thus, it is possible to vary the reactance of the electronic variable reactance element on the basis of the signal corresponding to the discharge rate such that the discharge rate is maximized.

The control unit further includes an alternating current oscillator configured to generate an alternating current to be supplied to the primary winding, and means for performing such control that a process of linearly varying and resetting an oscillation frequency of the alternating current oscillator is repeated in a predetermined cycle. The detection means includes means for varying a reference voltage in synchronization with the cycle, means for comparing the reference voltage and a voltage based on the signal, and means for, on the basis of a result of the comparison by the comparing means, detecting a predetermined oscillation frequency of the alternating current oscillator at which the discharge rate is maximized. The drive voltage of the drive unit is controlled by setting the oscillation frequency of the alternating current oscillator to the detected predetermined oscillation frequency.

Consequently it is possible to control the drive voltage of the drive unit by repeating the process of linearly varying and resetting the oscillation frequency in the predetermined cycle, varying the reference voltage in synchronization with the cycle, comparing the reference voltage and the voltage based on the signal, detecting, on the basis of a result of the comparison, the predetermined oscillation frequency of the alternating current oscillator at which the discharge rate is maximized, and setting the oscillation frequency of the alternating current oscillator to the predetermined oscillation frequency.

The detection means includes a discharge rate detection unit configured to detect the discharge rate of the fluid from the hole. Thus, it is possible to detect the discharge rate by the discharge rate detection unit and control the drive voltage and drive frequency on the basis of a signal corresponding to the detected value.

The detection means includes a sound detection unit configured to detect a sound corresponding to the discharge rate. Consequently, it is possible to detect the sound by the sound detection unit and control the drive voltage and drive frequency on the basis of the signal corresponding to the detected value.

The control means includes means for detecting a disturbance on the basis of the signals detected by the detection means when the piezoelectric body is being driven and when the driving is stopped. Thus, it is possible to judge whether there is the disturbance and precisely control the discharge rate.

Another piezoelectric pump according to an embodiment of the present invention is a piezoelectric pump including a plurality of piezoelectric pumps connected in parallel, each of the plurality of piezoelectric pumps including a pump body having a hole for introducing a fluid from outside thereinto and jetting the fluid from inside, a wall portion disposed so as to face the hole, and a piezoelectric body provided on the wall portion to vibrate the wall portion, a drive unit configured to drive the piezoelectric body, a detection means for detecting a signal corresponding to a discharge rate of the fluid from the hole, and a control unit configured to control a drive voltage and a drive frequency of the drive unit on the basis of the signal.

In the embodiment of the present invention, by adjusting the drive frequency of the piezoelectric body to the natural frequency of a piezoelectric pump corresponding to a position where an object to be cooled is located, the object to be cooled can be selectively and efficiently cooled.

A cooling device according to an embodiment of the present invention includes a pump body, a drive unit, a detection means, and a control unit. The pump body has a hole for introducing a fluid from outside thereinto and jetting the fluid from inside, a wall portion disposed so as to face the hole, and a piezoelectric body provided on the wall portion to vibrate the wall portion. The drive unit drives the piezoelectric body. The detection means detects a signal corresponding to a discharge rate of the fluid from the hole. The control unit controls a drive voltage and a drive frequency of the drive unit on the basis of the signal.

An electronic apparatus according to an embodiment of the present invention includes a piezoelectric pump and an electronic component. The piezoelectric pump includes a pump body having a hole for introducing a fluid from outside thereinto and jetting the fluid from inside, a wall portion disposed so as to face the hole, and a piezoelectric body provided on the wall portion to vibrate the wall portion, a drive unit configured to drive the piezoelectric body, a detection means for detecting a signal corresponding to a discharge rate of the fluid from the hole, and a control unit configured to control a drive voltage and a drive frequency of the drive unit on the basis of the signal. The electronic component is cooled by the fluid jetted from the piezoelectric pump.

The piezoelectric pump is used also as a speaker of the electronic apparatus. Thus, the speaker with the excellent reliability of a connection between voltage application wiring and an electrode can be obtained.

As described above, according to the embodiments of the present invention, the piezoelectric pump whose discharge rate is controllable can be provided.

These and other objects, features and advantages of the present invention will become more apparent in light of the following detailed description of best mode embodiments thereof, as illustrated in the accompanying drawings.

BRIEF DESCRIPTION OF DRAWINGS

FIGS. 6A and 6B are an enlarged plan view and a perspective view showing a portion where an electrode formed in a piezoelectric element and an annular connection portion are connected;

FIG. 7 is a sectional view taken along the line A-A of FIG. 6;

DESCRIPTION OF PREFERRED EMBODIMENTS

Hereinafter, embodiments of the present invention will be described below with reference to the drawings.

Figure 1:
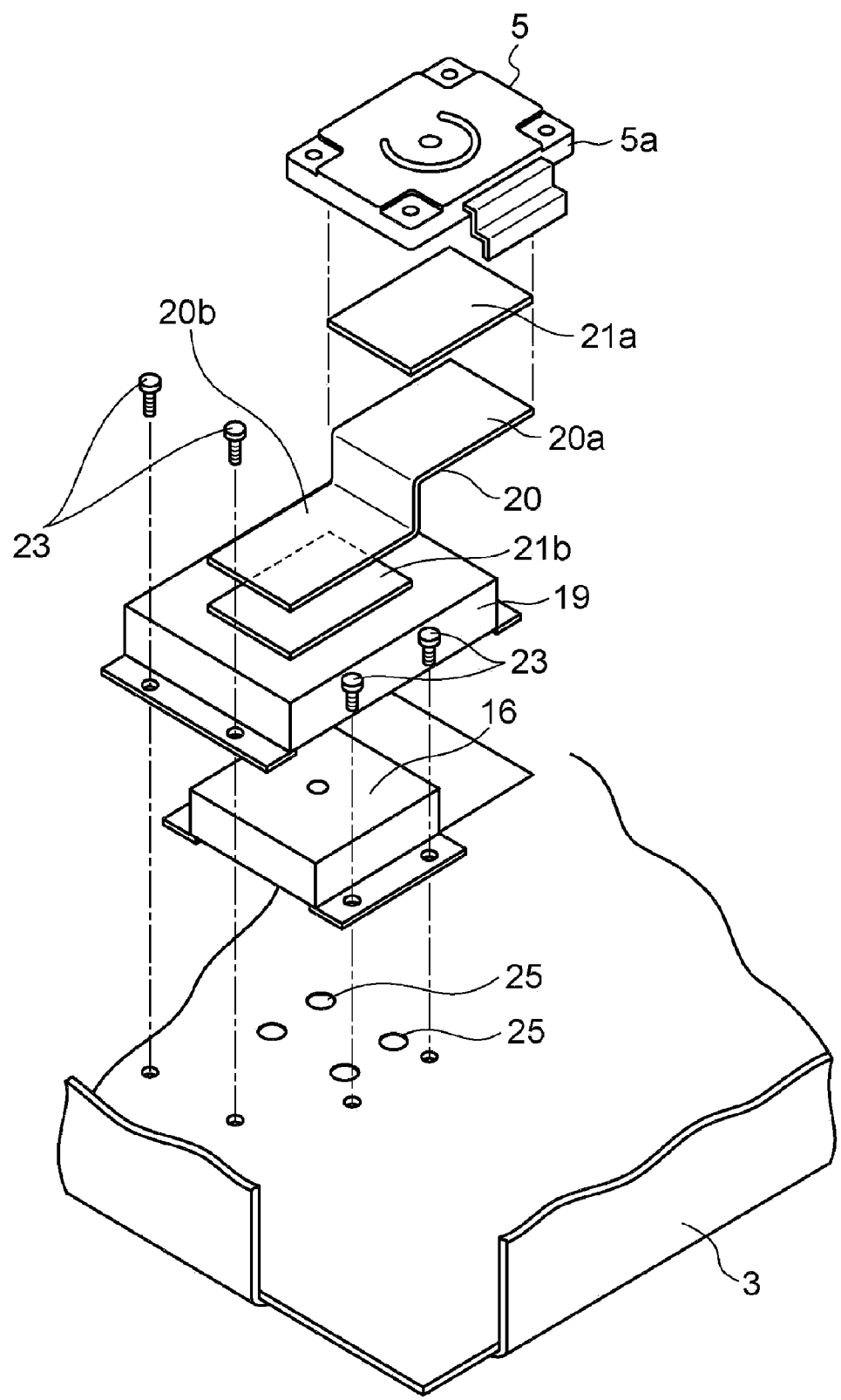
FIG. 1 is an exploded perspective view of a principal portion showing the constitution of a portable electronic apparatus according to an embodiment of the present invention.
Figure 2:
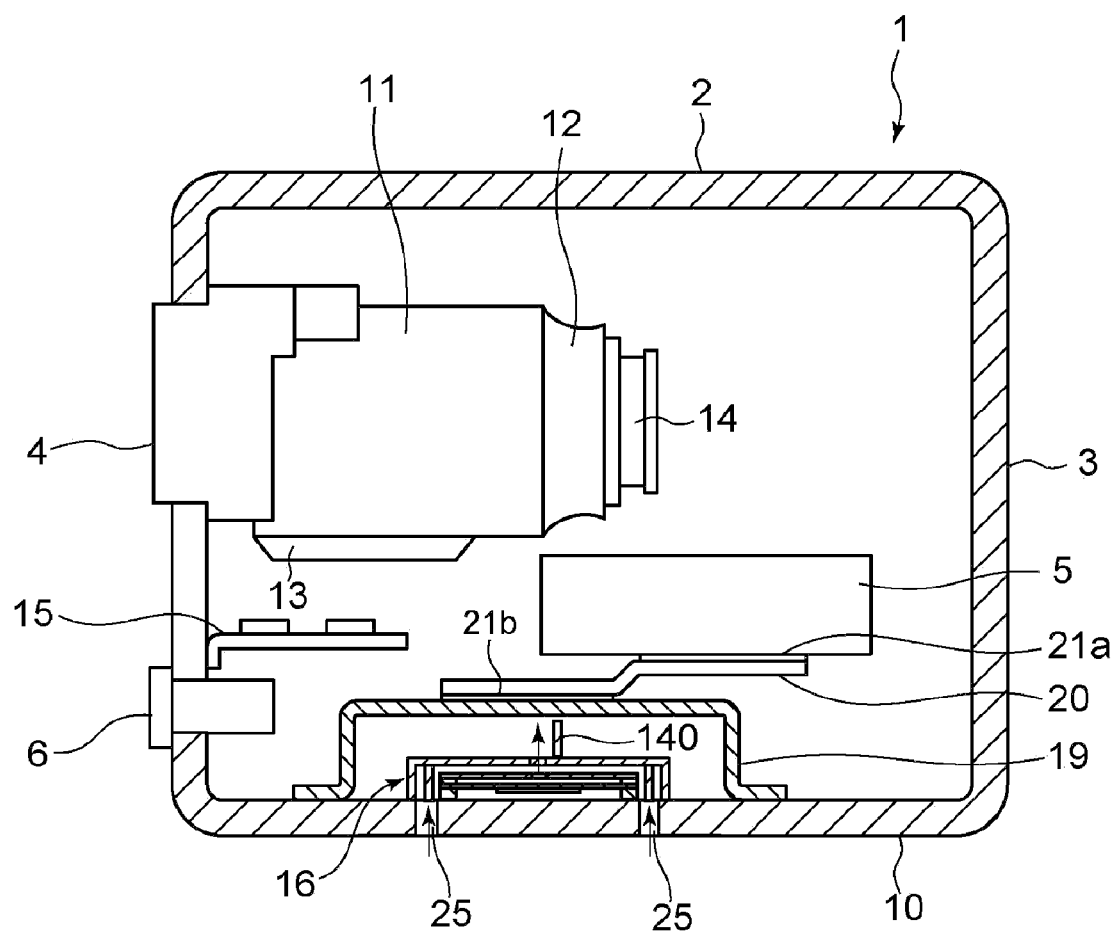
FIG. 2 is a sectional view of the portable electronic apparatus including a microphone and a lens.
Figure 3:
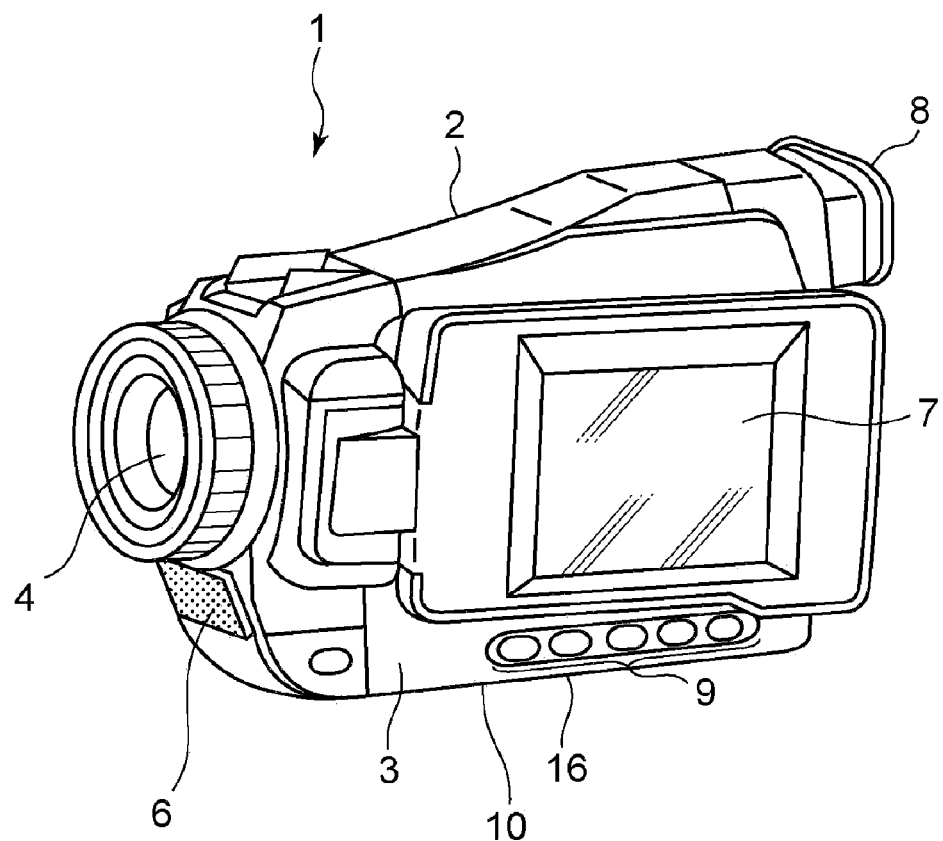
FIG. 3 is an external view of the portable electronic apparatus.

FIG. 1 is an exploded perspective view of a principal portion showing the constitution of a portable electronic apparatus according to an embodiment of the present invention, FIG. 2 is a sectional view of the portable electronic apparatus including a microphone and a lens, and FIG. 3 is an external view of the electronic apparatus. A portable video camera is taken here for an example of the portable electronic apparatus, but of course a portable phone or other electronic apparatuses are also available.

As shown in these figures, in a portable video camera 1, a captured subject image is video-recorded/reproduced by an HDD unit 5 mounted in a housing 3 of a camera body 2.

As shown in FIG. 3, the portable video camera 1 includes a lens 4 of a camera portion, a microphone 6 for collecting sound when an image is captured, a display portion 7 such as an LCD, which is rotatably and pivotally fitted to the camera body 2 and doubles as a monitor and a finder, an eyepiece 8, and an operation button group 9, and a cooling device 16 is disposed at a bottom portion 10 of the housing 3.

In many cases, the obverse side (underside in FIG. 1) of a casing 5a of the HDD unit 5 is a metal portion cast by aluminum die casting or the like, and the reverse side (upper side in FIG. 1) thereof is constituted by a printed-circuit board for driving, and therefore the casing 5a is joined to a heat transfer portion 20 made of metal such as copper and having high heat conductivity with a heat transfer sheet 21a therebetween with the obverse-side metal portion down.

The heat transfer portion 20 has a shape formed by bending both ends of a band-shaped copper plate in opposite directions to each other, and the heat transfer sheet 21a is joined to one bent piece 20a and fixed to the HDD unit 5. A heat transfer sheet 21b is also joined to the other bent piece 20b and joined to an upper surface of a sealed casing 19, and as shown in FIG. 2, the HDD unit 5 is fixed onto the sealed casing 19.

The sealed casing 19 and the cooling device 16 are fixed to the bottom portion 10 of the housing 3 by screws 23. Accordingly, heat raised to a high temperature by the HDD unit 5 is transferred to the heat transfer portion 20 and cooled by the cooling device 16.

Figure 4:
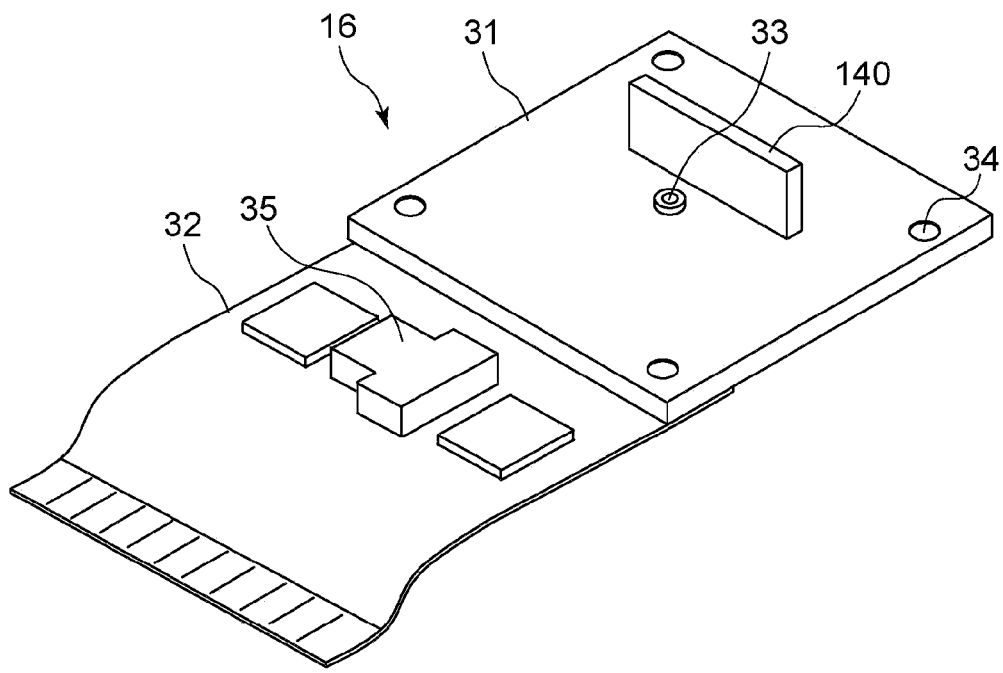
FIG. 4 is a perspective view of a cooling device.

FIG. 4 is a perspective view of the cooling device 16.

As shown in FIG. 4, the cooling device 16 includes a piezoelectric pump body 31, a drive circuit substrate 32 integrally connected to the piezoelectric pump body 31, and a flow sensor (discharge rate sensor, flow velocity sensor) 140.

A discharge hole 33 for jetting gas is formed nearly in the center of the piezoelectric pump body 31. Holes 34 serving as gas passages are formed at four corners of the piezoelectric pump body 31.

The flow sensor 140 is used for detecting the discharge rate (flow velocity) of gas discharged from the discharge hole 33. The flow sensor 140 is provided near the discharge hole 33 so as to protrude from an upper surface of the piezoelectric pump body 31. The flow sensor 140 may have the same constitution as that of the related art as described later.

A microtransformer 35 and so on which form part of a drive circuit for driving the piezoelectric pump body 31 are mounted on the drive circuit substrate 32.

Figure 5:
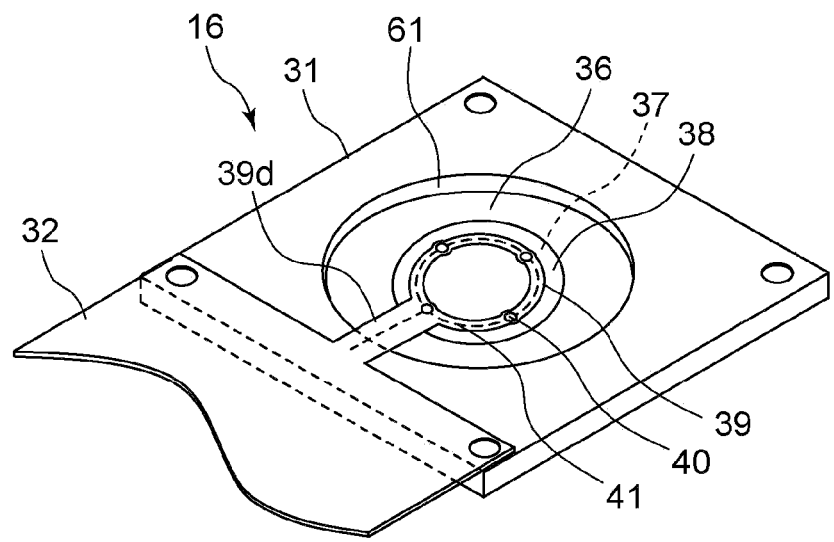
FIG. 5 is a perspective view of the bottom surface side of the cooling device.

FIG. 5 is a perspective view of the bottom surface side of the cooling device 16, FIGS. 6A and 6B are an enlarged plan view and a perspective view showing a portion where an electrode formed in a piezoelectric element and an annular connection portion are connected, and FIG. 7 is a sectional view taken along the line A-A of FIG. 6A.

As shown in FIG. 5, an opening 61 is formed in a bottom surface of the piezoelectric pump body 31, and a diaphragm 36 described later is exposed from the opening. The diaphragm 36 is provided with an electrode 38 with a piezoelectric element 37 therebetween.

An annular connection portion 39 is led out from the drive circuit substrate 32 via a lead-out portion 39d, and wiring 41 is routed in the annular connection portion 39 and so on. The annular connection portion 39 (wiring 41) is connected to the surface of the electrode 38 at a plurality of positions by solders 40 or the like.

As shown in FIGS. 6A and 6B, the solders 40 are provided on the circumference of a circle with a diameter L2, while the piezoelectric element 37 and the electrode 38 have a diameter L1. The circumference of the circle with the diameter L2 corresponds to, for example, the positions of vibration nodes of the piezoelectric element 37 when the piezoelectric element 37 is being driven as described later. The connection positions of the plurality of solders 40 are provided at even intervals in a circumferential direction of the annular connection portion 39.

As shown in FIG. 7, a metal plate, for example, having the same shape as the piezoelectric element 37 is used for the electrode 38. Through-holes are formed in the drive circuit substrate 32, and the electrode 38 and the wiring 41 are connected by the solders 40 in the through-holes.

Figure 8:
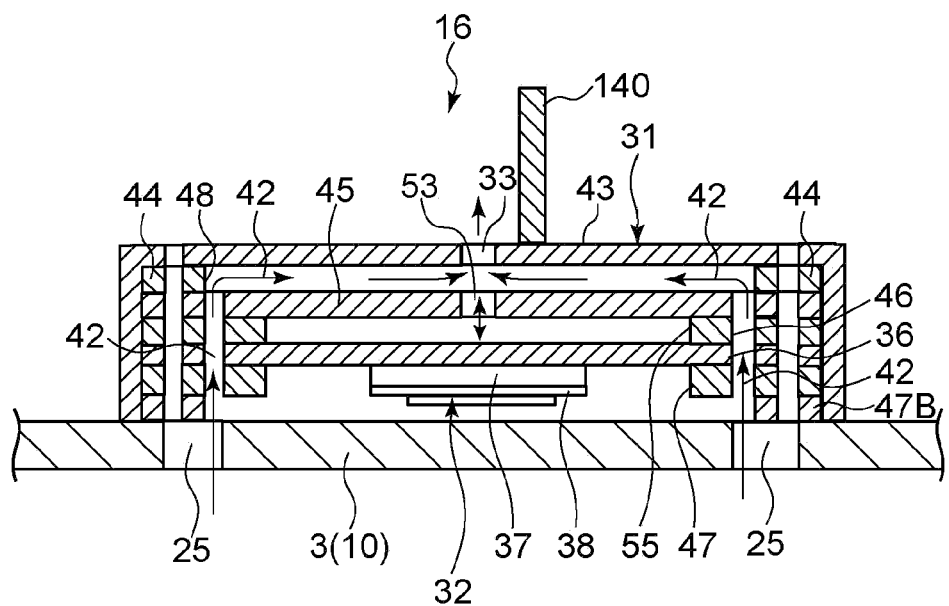
FIG. 8 is a sectional view showing the constitution of the cooling device.
Figure 9:
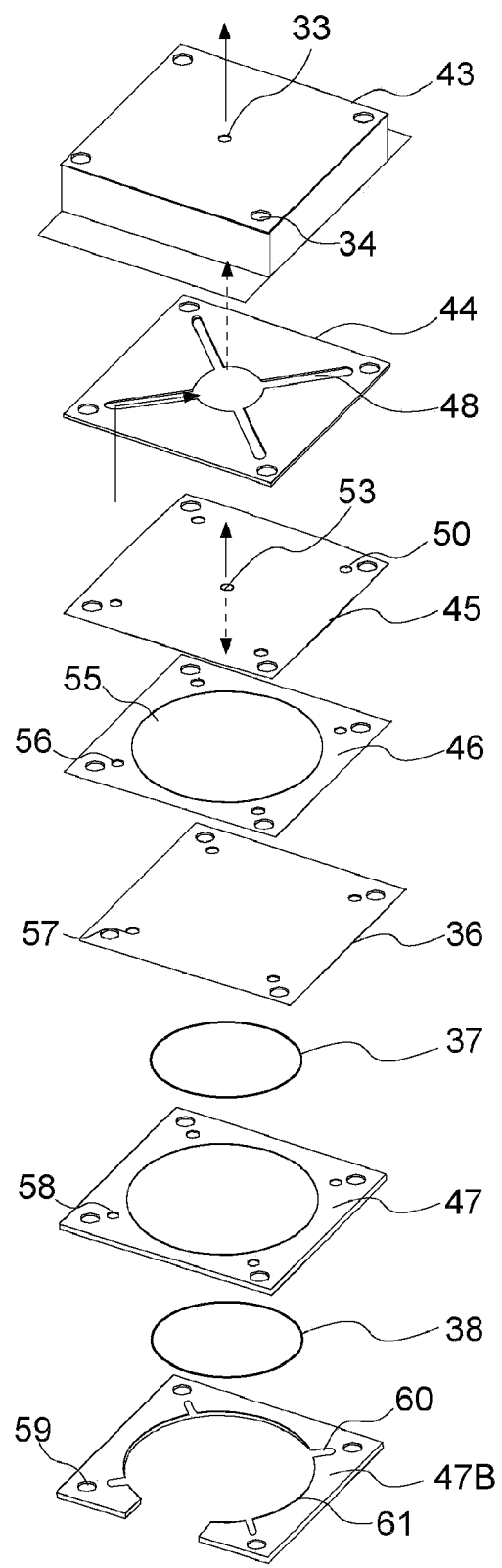
FIG. 9 is an exploded perspective view of a piezoelectric pump body.

FIG. 8 is a sectional view showing the constitution of the cooling device 16, and FIG. 9 is an exploded perspective view of the piezoelectric pump body 31. It should be noted that the flow sensor 140 is not shown in FIG. 9.

As shown in FIG. 8, the cooling device 16 includes the piezoelectric pump body 31 and the drive circuit substrate 32 integrally connected to the piezoelectric pump body 31.

As shown in FIG. 8, the piezoelectric pump body 31 includes, in order from the top, a top plate 43, an insertion plate 46 for forming a passage 42, a top plate 45 of a pump chamber, an insertion plate 46 for forming a space in the pump chamber, the diaphragm 36, the piezoelectric element 37 attached to a rear surface of the diaphragm 36, the electrode 38, a protection ring 47, and a ring 47B.

As shown in FIG. 9, the top plate 43 has, for example, an approximately box shape, and the discharge hole 33 for discharging gas jetted from the pump chamber toward the bent piece 20b is provided in the center of the top plate 43. It should be noted that the flow sensor 140 is provided near the discharge hole 33 so as to protrude from an upper surface of the top plate 43.

The insertion plate 44 has, for example, an approximately rectangular shape and includes a cross-shaped punched portion 48 to form a passage. A Venturi nozzle portion is provided at a position corresponding to the discharge hole 33, that is, in the center of the insertion plate 44 (an intersection portion of the cross-shaped punched portion 48).

The top plate 45 of the pump chamber has, for example, a square shape, and holes 50 are formed at respective corners and form the passage 42. The top plate 45 is provided with a hole 53 for introducing the gas into the pump chamber from the passage 42 and jetting the gas from inside the pump chamber toward the bent piece 20b through the discharge hole 33.

In the insertion plate 46 for forming the space in the pump chamber, a hole 55 for forming the space in the pump chamber is formed in its center and holes 56 are respectively formed at four corners to form the passage 42. The insertion plate 46 has a thickness sufficient to form the space serving as the pump chamber.

The diaphragm 36 also has the same shape as the top plate 45, and holes 57 are formed at respective corners to form the passage 42.

The piezoelectric element 37 has, for example, a circular shape and vibrates in response to an applied voltage (alternating voltage). A piezoelectric material such as lead zirconate titanate (PZT) is used for the piezoelectric element 37.

The protection ring 47 has the same shape as the above insertion plate 46 and so on, and holes 58 are formed at respective corners to form the passage 42.

A metal plate, for example, having the same shape as the piezoelectric element 37 is used for the electrode 38. It should be noted that in place of the electrode 38, the electrode may be formed by coating the surface of the piezoelectric element 37 with silver paste.

The ring 47B has the same shape as the protection ring 47, and cutout portions 60 are formed on the inside of the holes 50 at respective corners. The protection ring 47 and the ring 47B have a combined thickness sufficient to prevent the diaphragm 36, the piezoelectric element 37, and the annular connection portion 39 to hit the bottom portion 10 of the housing 3 by the vibration of the piezoelectric element 37 during the vibration.

Figure 10:
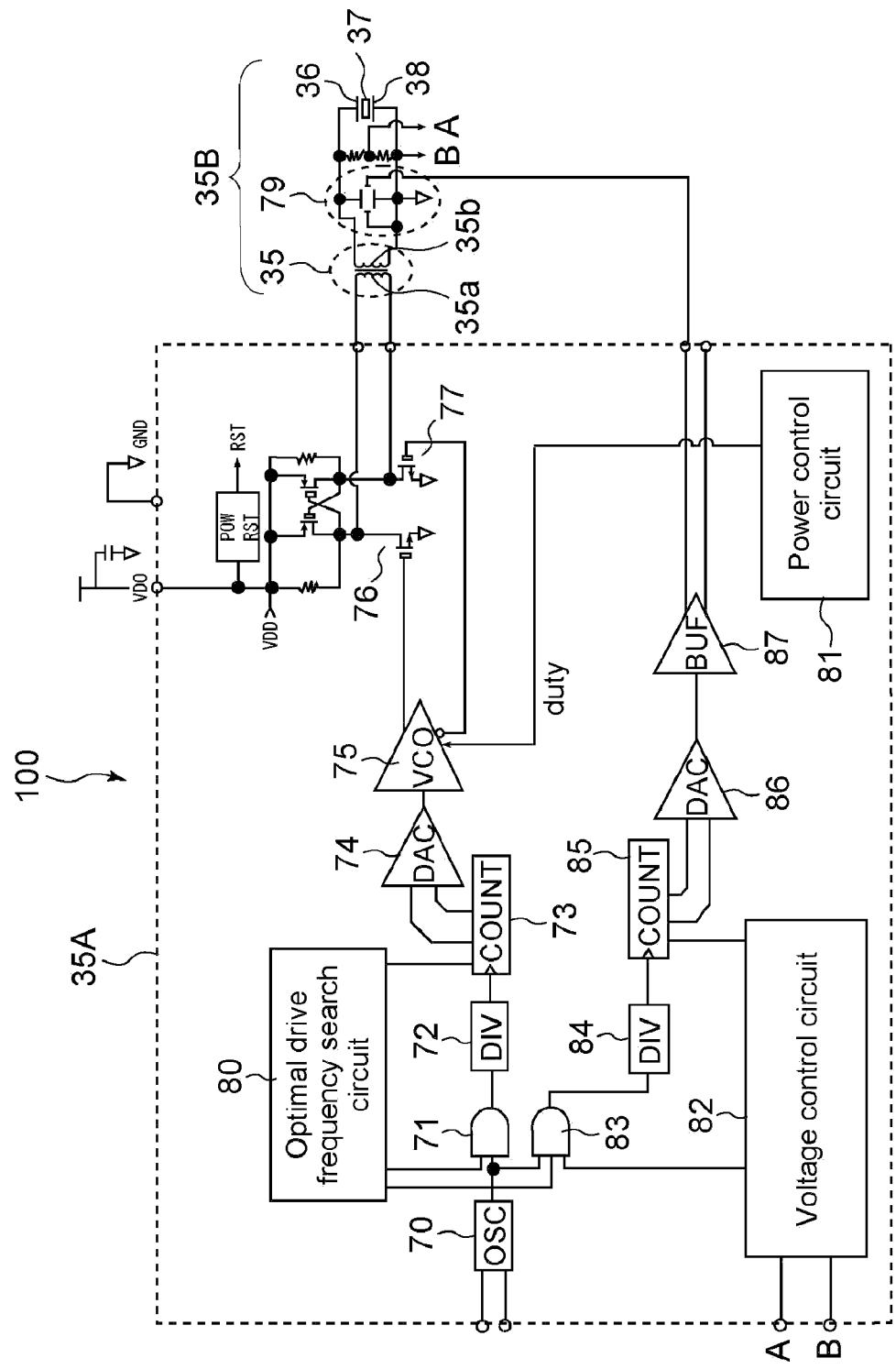
FIG. 10 is a block diagram showing a schematic configuration of a control system of the piezoelectric element.
Figure 11:
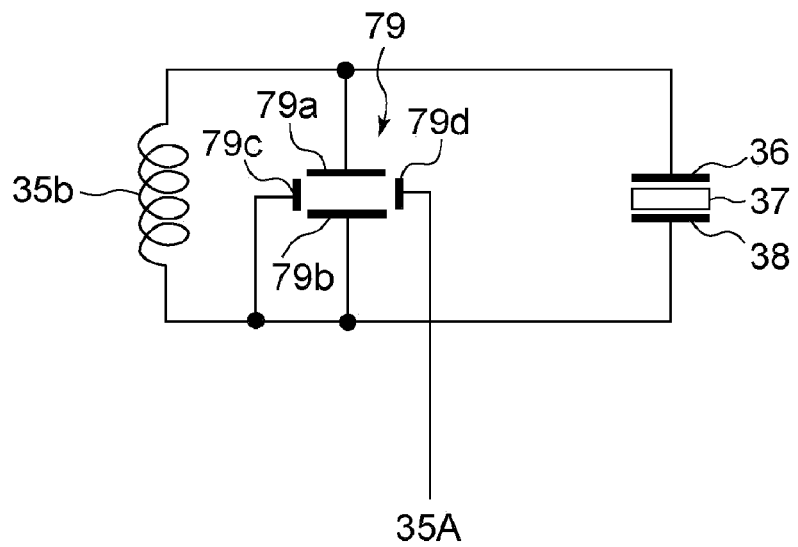
FIG. 11 is a diagram showing a circuit of the piezoelectric element side.

FIG. 10 is a block diagram showing a schematic configuration of a control system of the piezoelectric element 37, and FIG. 11 is a diagram showing a circuit of the piezoelectric element 37 side.

A control system 100 of the piezoelectric element 37 includes a drive control circuit 35A and a drive section 35B.

As shown in FIG. 11, the drive section 35B includes the microtransformer 35, a variable capacitor 79, the diaphragm 36, and the electrode 38. The drive section 35B has a configuration in which a secondary coil 35b, the diaphragm 36, and the electrode 38 are connected in series, and the variable capacitor 79 is connected in parallel therewith. Note that portions other than these are not shown in FIG. 11. The variable capacitor 79 includes input/output electrodes 79a and 79b and control electrodes 79c and 79d for changing the dielectric constant of the variable capacitor 47 to control the capacitance. For example, the control electrode 79d is connected to an output terminal of the drive circuit 35A. The piezoelectric element 37 is disposed between the diaphragm 36 and the electrode 38.

The drive control circuit 35A includes an oscillator (OSC) 70, an AND circuit 71, a DIV circuit 72, a counter circuit 73, a DAC (digital/analog convertor) 74, a VCO (voltage-controlled oscillator) 75, FETs 76 and 77, an optimal drive frequency search circuit 80, a power control circuit 81, a voltage control circuit 82, an AND circuit 83, a DIV 84, a counter circuit 85, a DAC 86, and a BUF (amplifier) 87.

A clock pulse signal of a predetermined frequency oscillated by the oscillator 70 is inputted to one input end of the AND circuit 71. The other input end of the AND circuit 71 is connected to an output end of the optimal drive frequency search circuit 80 described later. The clock pulse signal corresponding to a control output of the optimal drive frequency search circuit 80 is inputted to the DIV circuit (frequency dividing circuit) 72, where the frequency of the clock pulse signal is divided at a predetermined frequency division ratio, and inputted to the counter circuit 73. The counter circuit 73 counts output pulses of the DIV circuit (frequency dividing circuit) 72 and inputs a result of the counting not only to the DAC (digital/analog converter) 74 but also to the optimal drive frequency search circuit 80. The DAC 74 converts the count value into an analog signal and outputs the analog signal to the VCO 75.

Two output terminals of the VCO 75 are connected to gates of the FETs 76 and 77 respectively, and drains of the FETs 76 and 77 are connected to both ends of a primary coil 35a of the microtransformer. The VCO 75 performs on/off switching of the FETs 76 and 77 at a frequency corresponding to a control voltage from the DAC 74. Thus, the frequency of an alternating current flowing through the primary coil 35a of the microtransformer is controlled.

Figure 12:
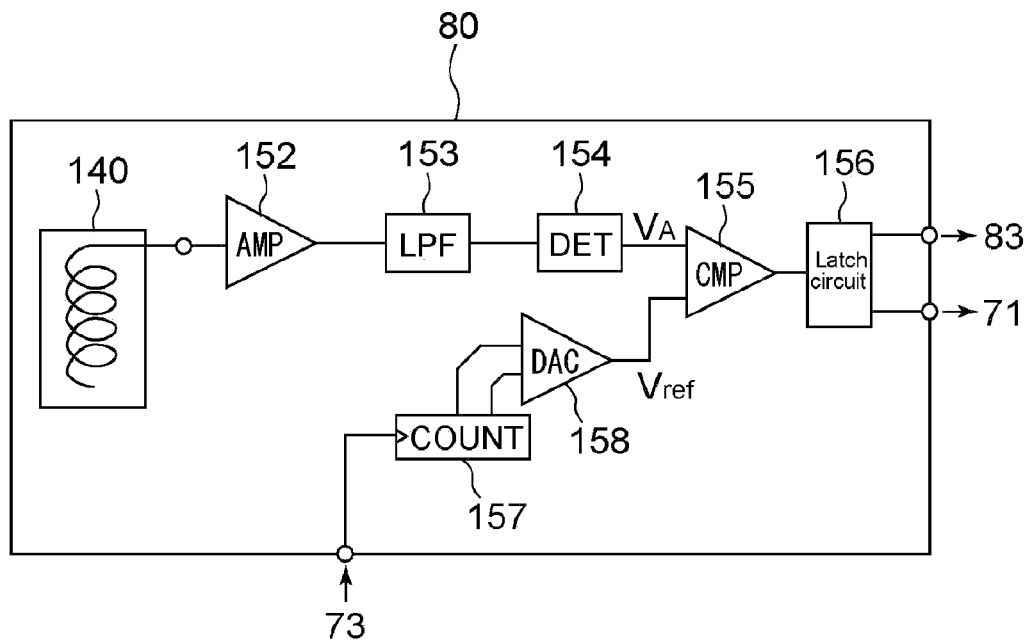
FIG. 12 is a circuit diagram showing details of an optimal drive frequency search circuit of FIG. 10.
Figure 13:
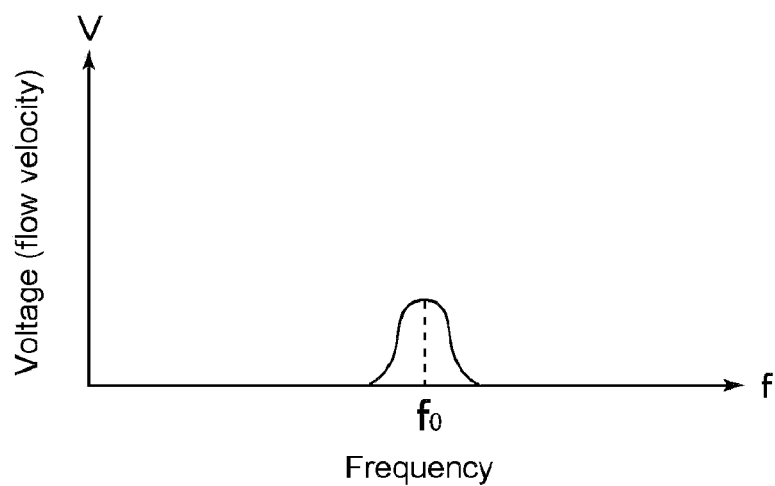
FIG. 13 is a diagram showing a relation between the drive frequency of the piezoelectric element and the voltage (flow velocity, discharge rate) detected by a flow sensor.

FIG. 12 is a circuit diagram showing details of the optimal drive frequency search circuit 80 of FIG. 10, and FIG. 13 is a diagram showing a relation between the drive frequency of the piezoelectric element 37 and the voltage (flow velocity, discharge rate) detected by the flow sensor 140.

When a drive frequency f of the piezoelectric element 37 is changed, a voltage V corresponding to the flow velocity (discharge rate) detected by the cooling device 16 shows such a characteristic as shown in FIG. 13. That is to say, when the piezoelectric element 37 is being driven at a predetermined drive frequency $f_0$, the discharge rate of the flow sensor 140 is maximized. The optimal drive frequency search circuit 80 is a circuit for detecting the drive frequency $f_0$ of the piezoelectric element 30 at which the voltage V (flow velocity, discharge rate) of the flow sensor 140 is maximized. The optimal drive frequency search circuit 80 is used for detecting the drive frequency $f_0$ at which the discharge rate (flow velocity) is maximized and fixing the drive frequency f to the drive frequency $f_0$.

As shown in FIG. 12, the optimal drive frequency search circuit 80 includes the flow sensor 140, an amplifier (AMP) 152, a low-pass filter (LPF) 153, an envelope detector (DET) 154, a comparator (CMP) 155, a latch circuit 156, a counter circuit 157, and a DAC (digital/analog converter) 158.

Figure 14:
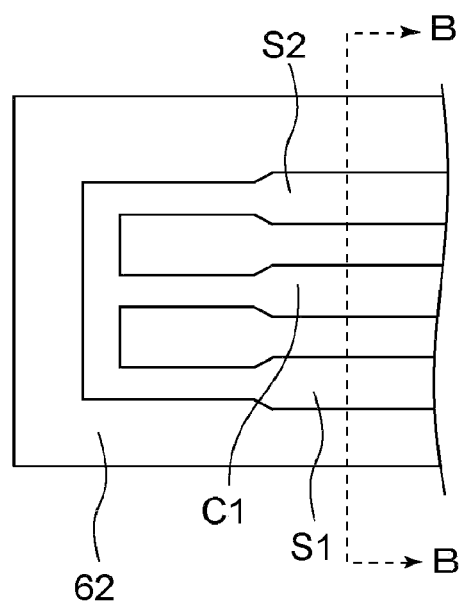
FIG. 14 is a partial plan view of the flow sensor.
Figure 15:
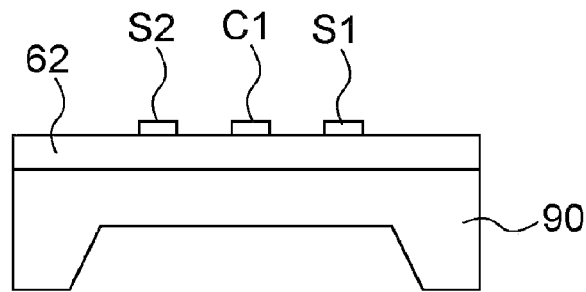
FIG. 15 is a sectional view taken along the line B-B of the flow sensor of FIG. 14.

FIG. 14 is a partial plan view of the flow sensor 140, and FIG. 15 is a sectional view taken along the line B-B of the flow sensor 140 of FIG. 14.

As shown in FIG. 14 and FIG. 15, the flow sensor 140 is a sensor capable of detecting a change in so-called gas particle velocity, for example, a change at a particle level in gas flow velocity (discharge rate), heat conduction amount, or the like. For example, the flow sensor 140 has a structure in which when air moves, the resistance values of resistors S1 and S2 of the flow sensor 140 change. In the flow sensor 140, a diaphragm 62, the resistors S1 and S2, and a common C1 which is a platinum resistor are formed on a semiconductor wafer 90.

Figure 16:
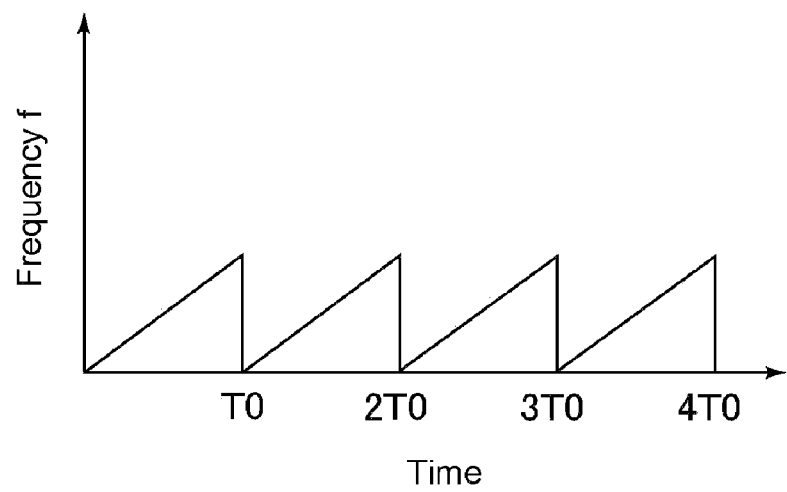
FIG. 16 is a diagram showing a relation between the drive frequency of the piezoelectric element and time (cycle)
Figure 17:
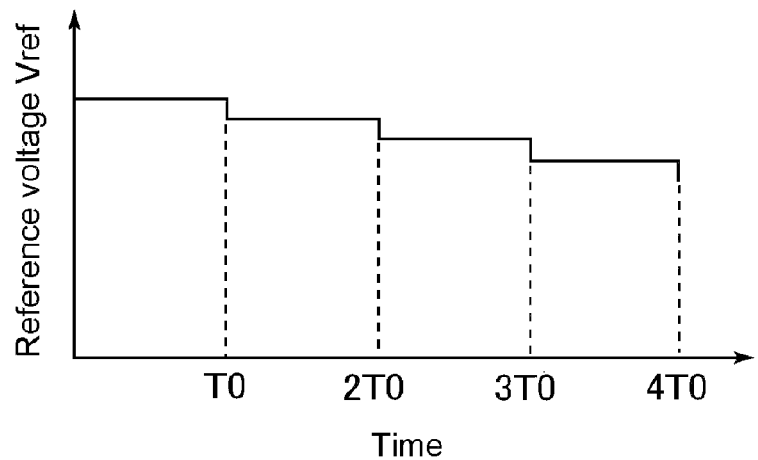
FIG. 17 is a diagram showing a relation between a voltage $V_{ref}$ serving as a reference and time (cycle)
Figure 18:
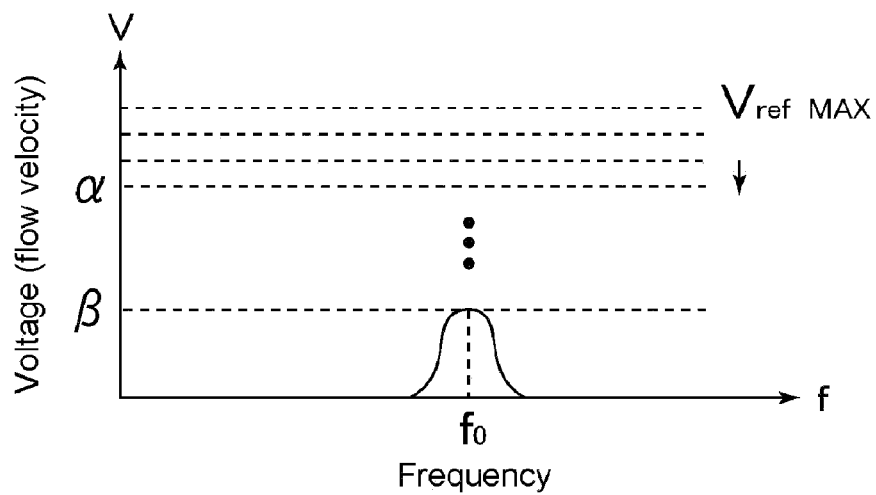
FIG. 18 is a diagram showing a relation between the voltage of the flow sensor and the drive frequency of the piezoelectric element.

FIG. 16 is a diagram showing a relation between the drive frequency f of the piezoelectric element 37 and time (cycle), FIG. 17 is a diagram showing a relation between a voltage $V_{ref}$ serving as a reference and time (cycle), and FIG. 18 is a diagram showing a relation between the voltage V of the flow sensor 140 and the drive frequency f of the piezoelectric element 37.

A detection signal detected by the flow sensor 140 is amplified by the amplifier 152 and inputted to the low-pass filter 153. In the low-pass filter 153, a low-frequency component is extracted from an output of the amplifier 152 and inputted to the envelope detector (DET) 154. The envelope detector (DET) 154 detects an amplitude value of an output of the low-pass filter 153 and outputs a voltage $V_A$ corresponding to the detected amplitude value to the comparator 155.

An output from the counter circuit 73 is inputted to the counter circuit 157. The counter circuit 157 counts output pulses of the counter circuit 73 and inputs a result of the counting to the DAC 158. The DAC 158 converts the count value into an analog signal and outputs the voltage $V_{ref}$ corresponding to the analog signal obtained by the conversion to the comparator 155.

At this time, as shown in FIG. 16, the drive frequency f of the piezoelectric element 37 repeats the process of increasing linearly and being reset in a predetermined cycle T0 and is swept in a saw-tooth pattern, and on the basis of the count value of the counter circuit 157, the voltage $V_{ref}$ decreases by a predetermined value in synchronization with each cycle T0 as shown in FIG. 17 and FIG. 18.

As shown in FIG. 18, the comparator 155 compares the inputted voltage $V_A$ and the voltage $V_{ref}$ and outputs a result of the comparison to the latch circuit 156.

Figure 19:
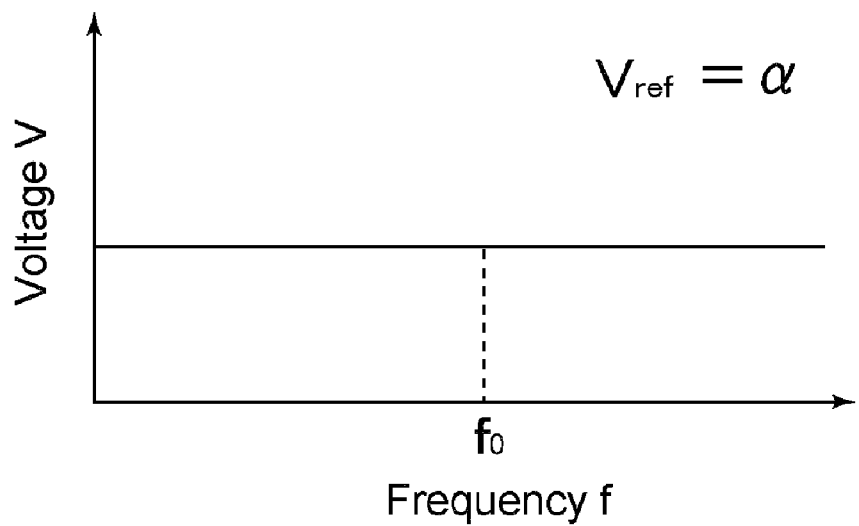
FIG. 19 is a diagram showing a relation between the output voltage of a comparator and the drive frequency.
Figure 19:
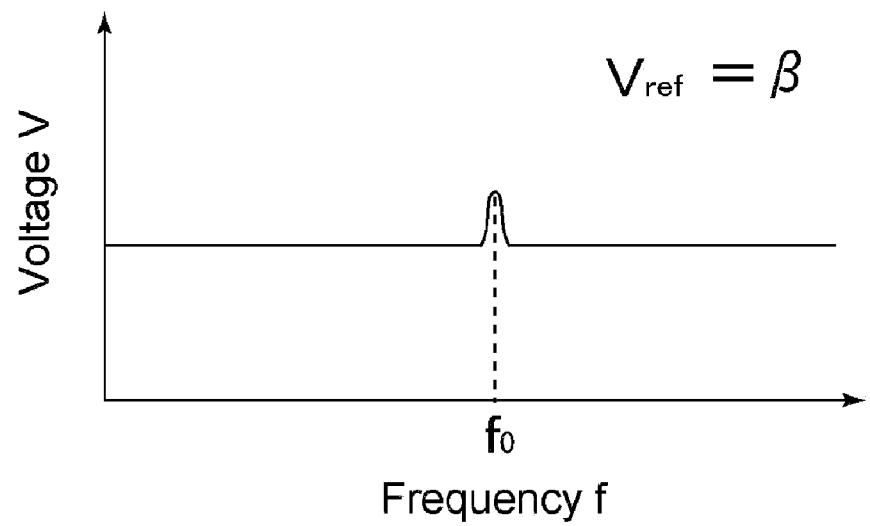
Figure 20:
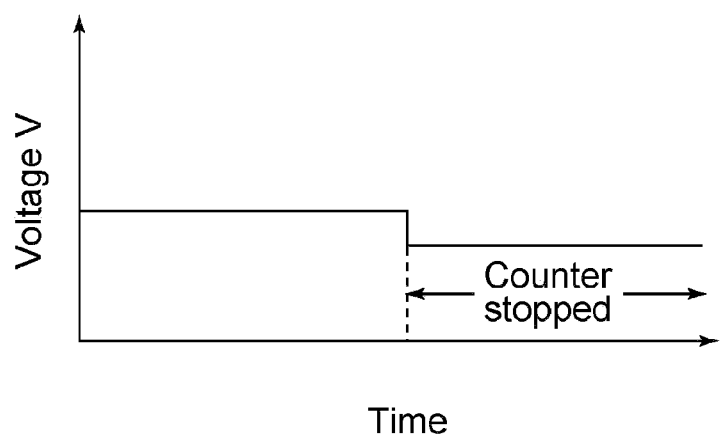
FIG. 20 is a diagram showing a relation between voltage and time.

FIG. 19 is a diagram showing a relation between the output voltage of the comparator 155 and the drive frequency f, and FIG. 20 is a diagram showing a relation between voltage and time.

When the voltage $V_{ref}$ is α, the voltage $V_{ref}$ is constant even if the drive frequency f is changed as shown in FIG. 19. At this time, the latch circuit 156 shown in FIG. 12 outputs an "on" signal to the AND circuit 71 and outputs an "off" signal to the AND circuit 83.

When the voltage $V_{ref}$ is β, the voltage $V_{ref}$ changes when the drive frequency f is $f_0$ if the drive frequency f is changed as shown in FIG. 19. At this time, the latch circuit 156 outputs an "off" signal to the AND circuit 71 and outputs an "on" signal to the AND circuit 83.

At this time, an output of the AND circuit 71 shown in FIG. 10 is turned off and the increase of the count value of the counter circuit 73 is stopped. As a result, a predetermined count value is converted into an analog signal by the DAC 74, and the on/off switching of the FETs 76 and 77 is performed at the predetermined drive frequency $f_0$ corresponding to the control voltage from the DAC 74. In other words, the sweeping of the drive frequency f is stopped and fixed at the optimal drive frequency $f_0$ (the drive voltage optimal for driving the piezoelectric element 37 is fixed).

The voltage control circuit 82 detects voltages at points A and B of a secondary-side circuit and variably controls the capacitance of the variable capacitor 79 on the basis of the detected voltages. More specifically, the voltage control circuit 82 switches a logical value inputted to the AND circuit 83.

Input ends of the AND circuit 83 are connected to a control output of the voltage control circuit 82, an output of the oscillator 70, and a control output of the optimal drive frequency search circuit 80. The control output of the voltage control circuit 82 is a variable output of the ratio between the time of H (logical value) and the time of L (logical value) according to a target controlled variable. Thus, a clock pulse signal corresponding to the control output of the voltage control circuit 82 and the control output of the optimal drive frequency search circuit 80 is inputted to the DIV 84. The frequency of the clock pulse signal inputted to the DIV 84 is divided at a predetermined frequency division ratio by the DIV 84, and the clock pulse signal is inputted to the counter circuit 85. The counter circuit 85 counts output pulses of the DIV 84 and inputs a result of the counting to the DAC 86 and the voltage control circuit 82. The DAC 86 converts the count value into an analog signal and outputs the analog signal to the BUF (amplifier) 87. The BUF (amplifier) 87 amplifies the signal from the DAC 86 and outputs the amplified signal to the variable capacitor 79. Thus, the capacitance of the variable capacitor 79 can be controlled.

The power control circuit 81 outputs a signal for controlling duty to the VCO 75.

As described above, according to this embodiment, even if the natural frequency of the piezoelectric element 37 changes, for example, due to the change of the ambient temperature, the drive voltage of the piezoelectric element 37 can be controlled by detecting the signal corresponding to the gas discharge rate of the cooling device 16 by the flow sensor 140, detecting the predetermined drive frequency $f_0$ at which the discharge rate is maximized on the basis of the voltage $V_A$ corresponding to the detected signal, and setting the oscillation frequency of the drive control circuit 35A to the drive frequency $f_0$, so that the discharge rate of the gas from the discharge hole 33 can be controlled at a proper rate (its maximum).

At this time, by repeating the process of linearly increasing and resetting the oscillation frequency in the predetermined cycle T0 as shown in FIG. 16, decreasing the reference voltage $V_{ref}$ in synchronization with each cycle T0 as shown in FIG. 17, comparing the reference voltage $V_{ref}$ and the voltage $V_A$ based on the signal from the flow sensor 140 by the comparator 155, detecting the predetermined drive frequency $f_0$ at which the discharge rate is maximized on the basis of a result of the comparison, and setting the oscillation frequency of the drive control circuit 35A to the drive frequency $f_0$, the drive voltage of the piezoelectric element 37 is controlled.

Moreover, it is possible to change the drive frequency by the drive control circuit 35A to control the capacitance of the variable capacitor 79 such that the discharge rate is maximized on the basis of the signal from the flow sensor 140, whereby it is possible to control the drive frequency at the natural frequency of the piezoelectric element 37 and increase (maximize) the discharge rate. It is only necessary that, for example, when the flow velocity (discharge rate) does not increase after the drive frequency is changed, the drive frequency be fixed at a value before the change.

Next, a practical example of the cooling device 16 will be described.

(1) Volume of Pump Chamber (area, height)

| Diameter | φ16 mm |
|---|---|
| Height | 0.15 mm |

(2) Area of Inlet Hole of Air from Outside
Diameter φ1.2 mm (four positions)
(3) Area of Outlet Hole of Air (discharge hole 33, hole 53)

| Pump chamber hole 53 | Diameter | φ0.6 mm |
|---|---|---|
| Discharge hole 33 | Diameter | φ0.8 mm |

(4) Total Volume of Cooling Device 16 (area, height)

| Area | 20 mm × 20 mm |
|---|---|
| Height | 1.6 mm |

(Height without nozzle. When the nozzle is provided, the nozzle height is 0.8 mm, and the total height is 2.4 mm.)
(5) Amplitude of Piezoelectric Element 37
  Approximately ±6 μm
(6) Vibration Frequency of Piezoelectric Element 37
  Approximately 24 kHz
(7) Diameter L1 of Piezoelectric Element 37
  6 mm
(8) Diameter L2 of Annular Connection Portion 39
(distance between solders 40)
  4 mm
(9) Flow Rate
  1.0 L/min A cooling device according to another embodiment of the present invention will be described. In this embodiment and the subsequent embodiments, the same numerals and symbols will be used to designate the same components as those in the above embodiment, the description thereof will be omitted, and different points will be mainly described.

Figure 21:
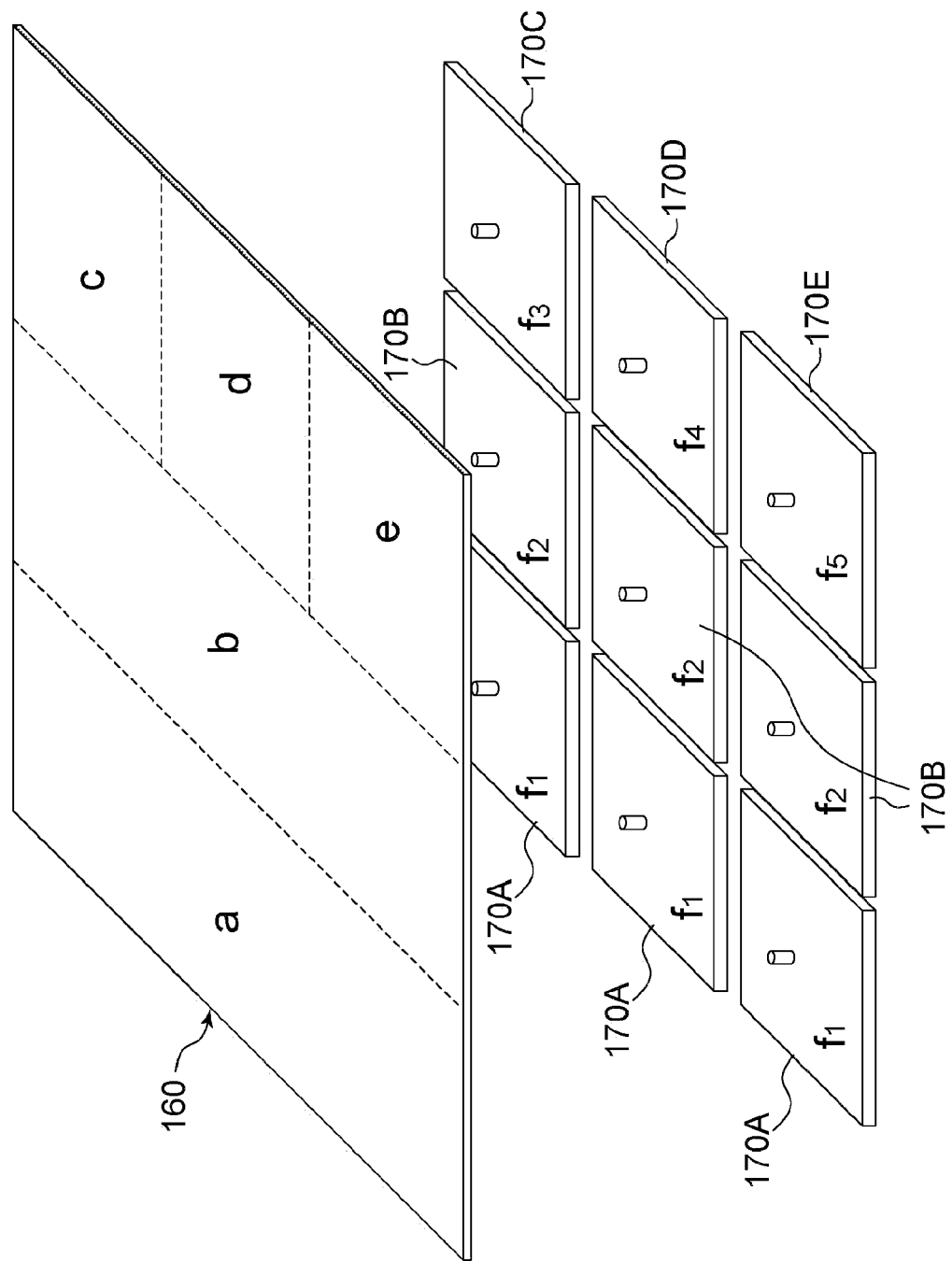
FIG. 21 is a perspective view of a cooling device of a second embodiment.

FIG. 21 is a perspective view of a cooling device of a second embodiment.

An electronic apparatus 200 of this embodiment differs in including a substrate 160 having a region a, a region b, a region c, a region d, and a region e on which electronic components (not shown) with different heating values are mounted, respectively, and a plurality of cooling devices 170A, 170B, 170C, 170D, and 170E which are arranged corresponding to the respective regions a to e and connected in parallel.

On the respective regions a to e of the substrate 160, electronic components having higher heating values in this order are mounted. That is to say, an electronic component having the highest heating value is mounted on the region a of the substrate 160, and an electronic component having the lowest heating value is mounted on the region e.

The natural frequency of the cooling device 170A is set to f1, the natural frequency of the cooling device 170B to f2, the natural frequency of the cooling device 170C to f3, the natural frequency of the cooling device 170D to f4, and the natural frequency of the cooling device 170E to f5. The natural frequencies f1 to f5 are set, for example, to have a relation of f1>f2>f3>f4>f5.

According to the above constitution, by making the drive frequency of the cooling device 170A the same as the natural frequency f1 of a piezoelectric element of the cooling device 170A, the largest amount of gas can be discharged from the cooling device 170A to the region a on which the electronic component having the highest heating value is mounted to efficiently cool the electronic component on the region a, and the electronic component of the region b can be cooled by another cooling device 170B.

Moreover, since the drive frequency can be controlled by the drive control circuit 35A, for example, it is possible to sequentially change the drive frequency to match the natural frequency of a cooling device corresponding to an electronic component on another region and efficiently cool only a specific region.

Figure 22:
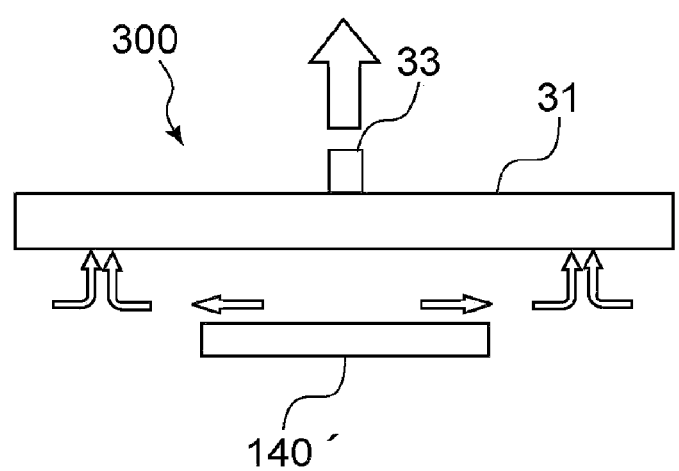
FIG. 22 is a perspective view of another cooling device.

FIG. 22 is a perspective view of another cooling device.

A cooling device 300 shown in FIG. 22 differs in that in order to detect a signal corresponding to the discharge rate of the cooling device 300, a flow sensor 140' is disposed to face a surface (surface from which the piezoelectric element and the diaphragm are exposed) opposite to the side on which the discharge hole 33 of the piezoelectric pump body 31 is disposed, with a predetermined space therebetween.

In this case, even if the size of the flow sensor 140' increases, the flow sensor 140' and the piezoelectric pump body 31 can be provided so as to overlap each other with the predetermined space therebetween, whereby the thickness of the cooling device can be easily reduced.

It is to be understood that the present invention is not intended to be limited to the above embodiments, and various changes may be made within the scope of the technical idea of the present invention.

For example, by using a microphone for detecting a sound corresponding to a discharge rate instead of using the flow sensor 140, the discharge rate may be controlled on the basis of a signal from the microphone.

The drive control circuit 35A may detect a disturbance on the basis of signals detected by the flow sensor 140 when the piezoelectric element 37 is being driven and when the driving is stopped. Thus, the influence of the disturbance can be eliminated and the discharge rate can be controlled more precisely.

For example, the diaphragm 36 may be used also as a speaker of the portable video camera 1. Thus, lower cost and reduced size and thickness can be realized.

In the above embodiments, the example in which the drive frequency or the like of the cooling device 16 is controlled by cooling the electronic component such as the HDD unit 5 by jetting gas and detecting the signal based on the discharge rate of the gas is shown. However, the present invention is not limited to this example, and for example, it is also possible to control the drive frequency or the like of the cooling device 16 by cooling the electronic component by jetting water or the like from the cooling device 16 and detecting a signal based on the discharge rate of the water or the like by the same flow sensor 140 or the like.

What is claimed is:

1. A piezoelectric pump comprising:
a pump body including (i) a pump chamber, (ii) a hole for introducing a fluid from outside the pump chamber and jetting the fluid from inside the pump chamber, (iii) a wall portion disposed so as to face the hole, and (iv) a piezoelectric body provided on the wall portion to vibrate the wall portion;
a drive unit configured to drive the piezoelectric body;
a detection means for detecting a signal corresponding to a discharge rate of the fluid from the hole; and
a control unit configured to control a drive voltage and a drive frequency of the drive unit on the basis of the signal.

2. The piezoelectric pump as set forth in claim 1,
wherein the drive unit includes
a pair of electrodes disposed to sandwich the piezoelectric body therebetween,
a transformer having a primary winding connected to the control unit and a secondary winding whose both ends are connected to the respective electrodes, and
an electronic variable reactance element connected in parallel with the secondary winding, and
wherein the control unit includes means for varying a reactance of the electronic variable reactance element such that the discharge rate is maximized on the basis of the signal to control the drive frequency.

3. The piezoelectric pump as set forth in claim 2,
wherein the control unit further includes,
an alternating current oscillator configured to generate an alternating current to be supplied to the primary winding, and
means for performing such control that a process of linearly varying and resetting an oscillation frequency of the alternating current oscillator is repeated in a predetermined cycle,
wherein the detection means includes,
means for varying a reference voltage in synchronization with the cycle,
means for comparing the reference voltage and a voltage based on the signal, and
means for detecting a predetermined oscillation frequency of the alternating current oscillator at which the discharge rate is maximized based on a result of the comparison by the comparing means, and
wherein the drive voltage of the drive unit is configured to be controlled by setting the oscillation frequency of the alternating current oscillator to the detected predetermined oscillation frequency.

4. The piezoelectric pump as set forth in claim 1,
wherein the detection means includes a discharge rate detection unit configured to detect the discharge rate of the fluid from the hole.

5. The piezoelectric pump as set forth in claim 1,
wherein the detection means includes a sound detection unit configured to detect a sound corresponding to the discharge rate.

6. The piezoelectric pump as set forth in claim 1,
wherein the control unit includes means for detecting a disturbance on the basis of the signals detected by the detection means when the piezoelectric body is being driven and when the driving is stopped.

7. A piezoelectric pump comprising
a plurality of piezoelectric pumps connected in parallel,
each of the plurality of piezoelectric pumps including,
a pump body including (i) a pump chamber, (ii) a hole for introducing a fluid from outside the pump chamber and jetting the fluid from inside the pump chamber, (iii) a wall portion disposed so as to face the hole, and (iv) a piezoelectric body provided on the wall portion to vibrate the wall portion,
a drive unit configured to drive the piezoelectric body,
a detection means for detecting a signal corresponding to a discharge rate of the fluid from the hole, and
a control unit configured to control a drive voltage and a drive frequency of the drive unit on the basis of the signal.

8. A cooling device comprising:
a pump body including (i) a pump chamber, (ii) a hole for introducing a fluid from outside the pump chamber and jetting the fluid from inside the pump chamber, (iii) a wall portion disposed so as to face the hole, and (iv) a piezoelectric body provided on the wall portion to vibrate the wall portion;
a drive unit configured to drive the piezoelectric body;
a detection means for detecting a signal corresponding to a discharge rate of the fluid from the hole; and
a control unit configured to control a drive voltage and a drive frequency of the drive unit on the basis of the signal.

9. An electronic apparatus comprising:
a piezoelectric pump including,
   a pump body having (i) a pump chamber, (ii) a hole for introducing a fluid from outside the pump chamber and jetting the fluid from inside the pump chamber, (iii) a wall portion disposed so as to face the hole, and (iv) a piezoelectric body provided on the wall portion to vibrate the wall portion,
   a drive unit configured to drive the piezoelectric body,
   a detection means for detecting a signal corresponding to a discharge rate of the fluid from the hole, and
   a control unit configured to control a drive voltage and a drive frequency of the drive unit on the basis of the signal; and
an electronic component configured to be cooled by the fluid jetted from the piezoelectric pump.

10. The electronic apparatus as set forth in claim 9,
wherein the piezoelectric pump is used also as a speaker of the electronic apparatus.

11. The piezoelectric pump as set forth in claim 1,
wherein the hole is configured to jet fluid from the pump chamber through another hole in the pump body.

12. The piezoelectric pump as set forth in claim 11, further comprising:
a discharge rate sensor protruding from the pump body near the another hole to detect the discharge rate of the fluid discharged from the hole.

13. The piezoelectric pump as set forth in claim 12,
wherein the hole is vertically aligned with the another hole relative to the pump body.

\* \* \* \* \*